(12) United States Patent
Fehrer et al.

(10) Patent No.: US 8,581,280 B2
(45) Date of Patent: Nov. 12, 2013

(54) OPTOELECTRONIC SEMICONDUCTOR CHIP

(75) Inventors: Michael Fehrer, Bad Abbach (DE); Uwe Strauss, Bad Abbach (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 12/223,382

(22) PCT Filed: Dec. 20, 2006

(86) PCT No.: PCT/DE2006/002293
§ 371 (c)(1),
(2), (4) Date: Dec. 22, 2008

(87) PCT Pub. No.: WO2007/085218
PCT Pub. Date: Aug. 2, 2007

(65) Prior Publication Data
US 2009/0315048 A1    Dec. 24, 2009

(30) Foreign Application Priority Data

Jan. 27, 2006 (DE) .................. 10 2006 004 172
Apr. 4, 2006 (DE) .................. 10 2006 015 788

(51) Int. Cl.
*H01L 33/00* (2010.01)

(52) U.S. Cl.
USPC .......... 257/98; 257/99; 257/103; 257/E29.33

(58) Field of Classification Search
USPC ................. 257/98–99, 103, E29.33
See application file for complete search history.

(56) References Cited

U.S. PATENT DOCUMENTS

| | | | |
|---|---|---|---|
| 5,789,265 A | 8/1998 | Nitta et al. | |
| 6,495,862 B1 | 12/2002 | Okazaki et al. | |
| 6,791,119 B2 * | 9/2004 | Slater et al. | 257/99 |
| 2002/0042864 A1 | 4/2002 | Iizuka | |
| 2002/0123164 A1 | 9/2002 | Slater et al. | |
| 2002/0179910 A1 * | 12/2002 | Slater, Jr. | 257/77 |
| 2003/0103516 A1 * | 6/2003 | Kitatani et al. | 370/419 |
| 2003/0151042 A1 | 8/2003 | Hueschen | |
| 2003/0173575 A1 | 9/2003 | Eisert et al. | |

(Continued)

FOREIGN PATENT DOCUMENTS

| | | |
|---|---|---|
| DE | 695 04 276 | 4/1999 |
| DE | 200 22 541 | 2/2002 |

(Continued)

OTHER PUBLICATIONS

Davis, P.C. W., "Quantum Tunneling Time", Am. J. Phys., 73 (1), Jan. 2005, pp. 23-27.

(Continued)

*Primary Examiner* — Eugene Lee
*Assistant Examiner* — Elias M Ullah
(74) *Attorney, Agent, or Firm* — Cozen O'Connor

(57) ABSTRACT

An optoelectronic semiconductor chip (1) having a semiconductor layer sequence (2), which comprises an active region (3) suitable for generating radiation and has a lateral main extension direction. The semiconductor layer sequence is arranged by a substrate (4) having a side surface (17), the side surface has a side surface region (18) that is beveled with respect to the main extension direction, and/or a cutout (21), and the semiconductor chip has a radiation-transmissive and electrically conductive contact layer (5).

24 Claims, 5 Drawing Sheets

(56) References Cited

U.S. PATENT DOCUMENTS

| | | |
|---|---|---|
| 2004/0200882 A1 | 10/2004 | Slater, Jr. et al. |
| 2004/0266043 A1 | 12/2004 | Oohata et al. |
| 2005/0042864 A1 | 2/2005 | Bruderl et al. |
| 2005/0173724 A1 | 8/2005 | Liu |
| 2006/0175628 A1 | 8/2006 | Otsuka et al. |
| 2011/0182317 A1* | 7/2011 | Brick et al. ............ 372/50.124 |

FOREIGN PATENT DOCUMENTS

| | | |
|---|---|---|
| DE | 10 2004 050 891 | 4/2006 |
| EP | 0 709 939 | 10/1995 |
| EP | 1 411 557 | 10/2003 |
| JP | 09-129930 | 5/1997 |
| JP | 2003-523635 | 8/2003 |
| JP | 2004-521494 | 7/2004 |
| JP | 2005-510062 | 4/2005 |
| JP | 2005-268601 | 9/2005 |
| WO | WO 01/61764 | 8/2001 |
| WO | WO 01/61765 | 8/2001 |
| WO | WO 02/061847 | 8/2002 |
| WO | WO 03/043092 | 5/2003 |
| WO | WO 2005/029588 | 3/2005 |
| WO | WO 2005/101498 | 10/2005 |
| WO | WO 2006/002614 | 1/2006 |

OTHER PUBLICATIONS

Esaki Diode Definition of Esaki Diode in the Free Online Encyclopedia (http//:encyclopedia2.thefreedictionary.com/Esaki+diode),(1 page).

* cited by examiner

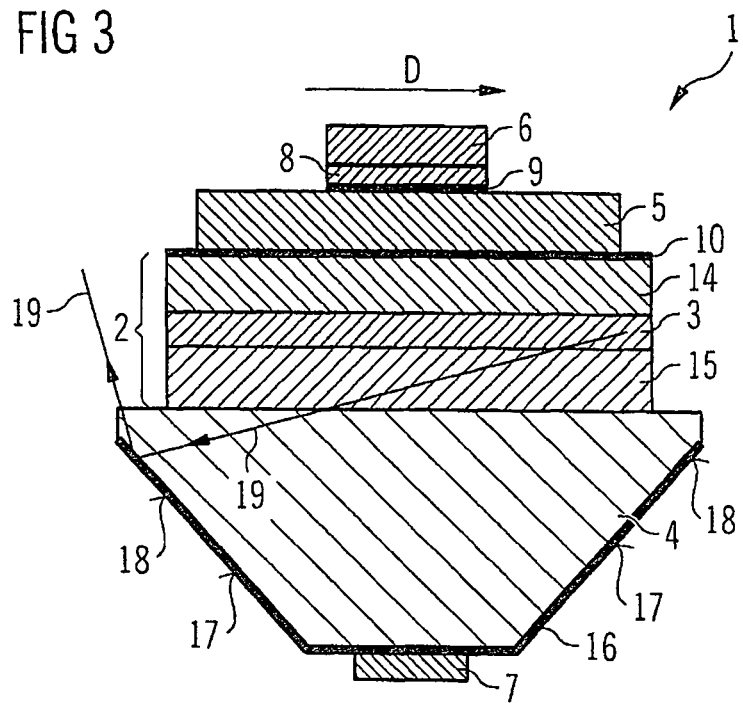
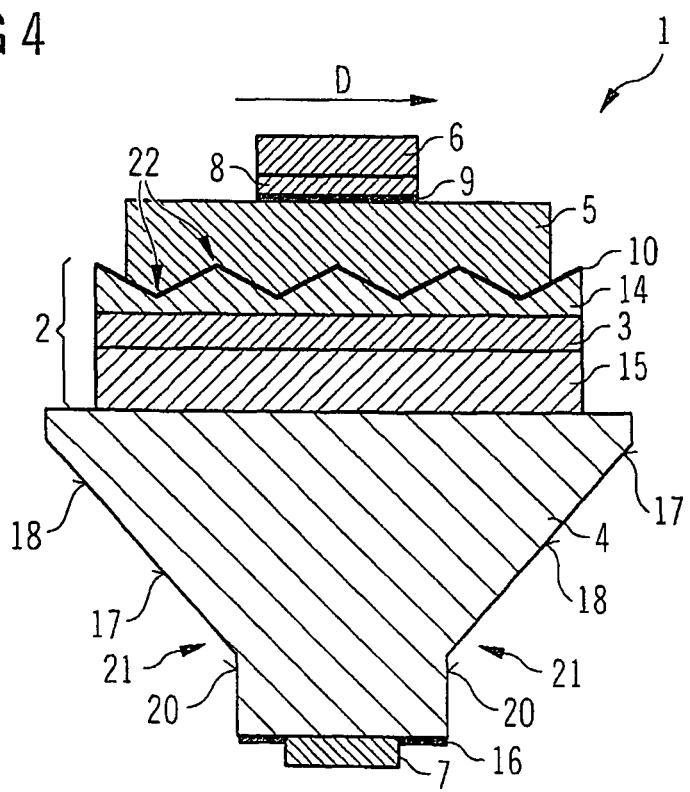

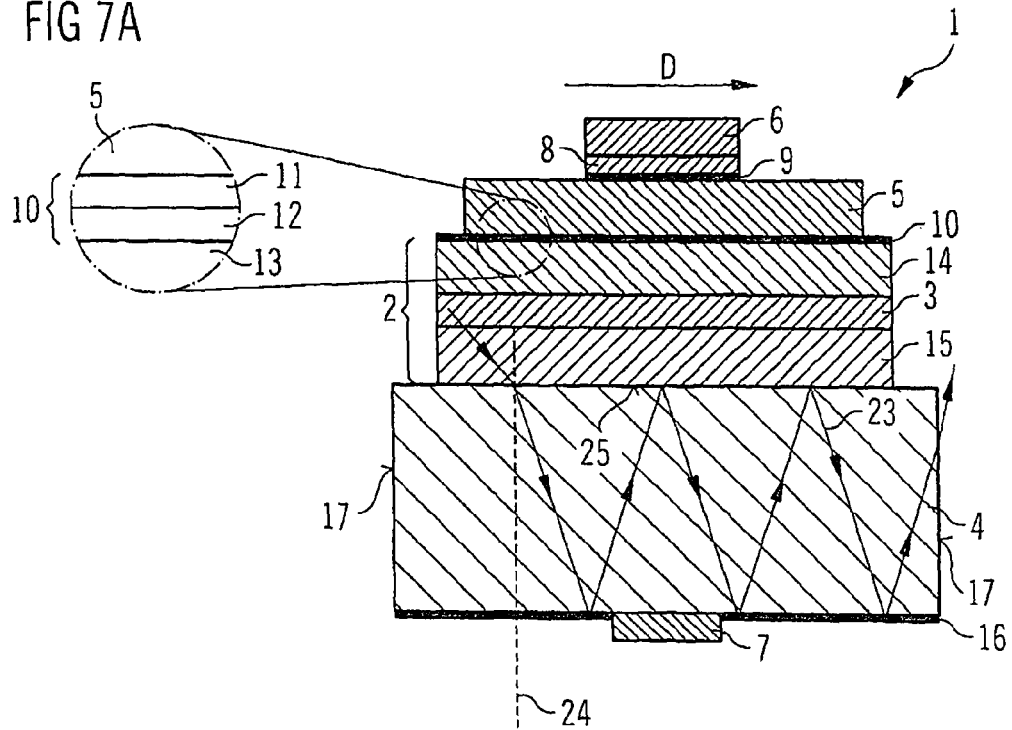
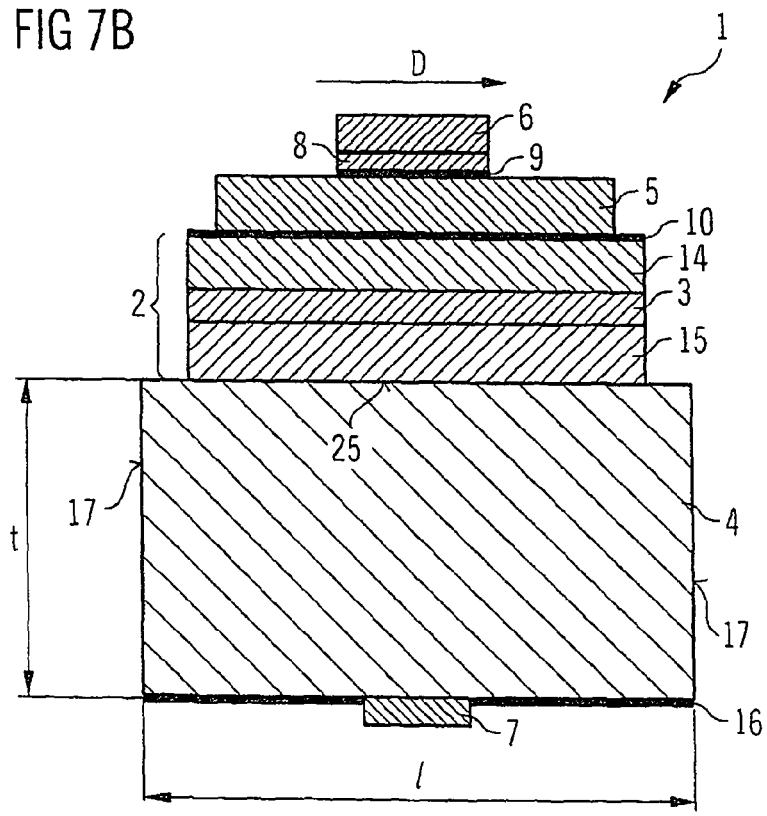

OPTOELECTRONIC SEMICONDUCTOR CHIP

RELATED APPLICATIONS

This is U.S. national stage under 35 U.S.C. 371 of application No. PCT/DE2006/002293 filed on 20 Dec. 2006. This patent application claims the priority of German Patent Application No. 10 2006 004 172.0 filed Jan. 27, 2006 and 10 2006 015 788.5 filed Apr. 4, 2006, the entire content of both of which is hereby incorporated by reference.

FIELD OF THE INVENTION

The present invention relates to an optoelectronic semiconductor chip, in particular a radiation-emitting semiconductor chip.

SUMMARY OF THE INVENTION

It is an object of the present invention to specify an improved optoelectronic semiconductor chip, in particular a semiconductor chip having increased coupling-out efficiency.

In accordance with at least one embodiment, the optoelectronic semiconductor chip comprises a semiconductor layer sequence having an active region suitable for generating radiation, wherein the semiconductor layer sequence preferably has a lateral main extension direction. The semiconductor layer sequence is preferably arranged on a substrate. The substrate can comprise the growth substrate on which the semiconductor layer sequence is grown, in particular epitaxially, or can be formed from said growth substrate or be embodied from it, for instance by means of patterning or some other processing. The substrate can be thinned, in particular. The structural height of the chip is advantageously reduced by the substrate being thinned. Preferably, the substrate, in particular also the processed, for example thinned, substrate, mechanically stabilizes the semiconductor layer sequence.

In accordance with at least one embodiment, the semiconductor layer sequence, in particular the active region, contains or is based on a nitride compound semiconductor material.

In the present context, "based on nitride compound semiconductors" means that the semiconductor layer sequence or at least one layer thereof comprises a nitride III/V compound semiconductor material, preferably $Al_nGa_mIn_{1-n-m}N$ where $0 \leq n \leq 1$, $0 \leq m \leq 1$ and $n+m \leq 1$. It is preferably the case here that $n \neq 0$ and/or $m \neq 0$. It is furthermore preferably the case that $n \neq 1$ and/or $m \neq 0$. In this case, said material need not necessarily have a mathematically exact composition according to the above formula. Rather, it can have one or more dopants and additional constituents which essentially do not change the characteristic physical properties of the $Al_nGa_mIn_{1-n-m}N$ material. For the sake of simplicity, however, the above formula only comprises the essential constituents of the crystal lattice (Al, Ga, In, N), even if these can be replaced in part by small quantities of further substances.

Nitride compound semiconductor materials are particularly suitable for generating radiation in the ultraviolet and also the visible spectral range, in particular from the blue to the green spectral range.

For a semiconductor layer sequence based on nitride compound semiconductors, a silicon carbide (SiC), gallium nitride (GaN), aluminum nitride (AlN) or sapphire containing substrate is particularly suitable as the (growth) substrate.

In accordance with at least one embodiment, the active region comprises a single or multiple quantum well structure. In the context of the application, the designation quantum well structure encompasses any structure in which charge carriers can experience or preferably experience a quantization of their energy states as a result of confinement. In particular, the designation quantum well structure comprises no indication about the dimensionality of the quantization. It therefore encompasses, inter alia, quantum wells, quantum wires and quantum dots and any combination of these structures. A quantum well structure is particularly suitable for generating radiation with high internal quantum efficiency.

In accordance with at least one embodiment, the substrate is radiation-transmissive to the radiation generated in the active region. The substrate can be formed, in particular, from a material that is transmissive to the radiation generated. By comparison with a significantly absorbent substrate, this facilitates the coupling out of radiation from the semiconductor chip through the substrate. The semiconductor chip can thus be formed as a volume emitter in a simplified manner. In the case of a volume emitter, in contrast to a surface emitter, that is to say a semiconductor chip in which radiation is coupled out predominantly, for example 90% or more of the total radiation power coupled out from the chip, via a, in particular a single, surface of the semiconductor layer sequence, a significant proportion of radiation is coupled out from the chip via the substrate as well. The surface luminance at the coupling-out areas of the semiconductor chip is reduced in the case of a volume emitter by comparison with a surface emitter, wherein the risk of discolorations or opacities (caused by high luminances), for example the browning, of a radiation-transmissive encapsulation into which the semiconductor chip can be embodied is reduced on account of the reduced surface luminance at the coupling-out areas.

This is particularly advantageous in the case of a semiconductor chip embodied for generating high-energy, comparatively short-wave, for example blue or ultraviolet radiation. This is often the case for example with a semiconductor chip based on nitride compound semiconductors. An encapsulation containing a reaction resin, for example an epoxy or acrylic resin, becomes turbid particularly rapidly under irradiation with high-energy radiation, such that a volume emitter affords particular advantages here. The risk of a radiation-dictated discoloration or opacity of the encapsulation can be more extensively reduced by an encapsulation which contains a silicone or a silicone resin and which is distinguished by increased radiation stability.

Preferably, the semiconductor chip is free of a reflector, embodied for example in metallic fashion or as a Bragg mirror, between the semiconductor layer sequence and the substrate, thus facilitating the entrance of radiation from the semiconductor layer sequence into the substrate and hence the formation of a volume emitter.

In accordance with at least one embodiment, a surface of the substrate, in particular a side surface and/or a surface of the substrate that faces the semiconductor layer sequence, is formed as a radiation coupling-out area of the semiconductor chip. If that surface of the substrate which faces the semiconductor layer sequence is formed as a radiation coupling-out area, then a partial region of said surface which is not covered by the semiconductor layer sequence preferably forms a coupling-out region of said surface.

In accordance with at least one embodiment, the refractive index of the substrate is greater than or equal to the refractive index of the active region, and/or the refractive index of the substrate is greater than or equal to the refractive index of a semiconductor layer of the layer sequence that terminates the semiconductor layer sequence on the side facing the substrate, in particular that delimits the semiconductor layer sequence. The transfer of radiation from the semiconductor layer sequence into the substrate is thereby facilitated on account of the reduced reflection or the omitted total reflection at the interface with the substrate. For the refractive index of the active region, it is possible to use, if appropriate, a mean value, for example the arithmetic or geometric mean of the refractive indices of the layers forming the active region.

For nitride compound semiconductor materials, an SiC or GaN containing substrate is particularly suitable with regard to the above relation for the refractive indices.

In accordance with at least one embodiment, the semiconductor chip has a side surface, wherein the side surface preferably has a side surface region that is beveled with respect to the lateral main extension direction of the semiconductor layer sequence, and/or a cutout. The side surface is preferably formed by a side surface of the substrate. Furthermore, the side surface preferably laterally delimits the semiconductor chip. The cutout preferably extends from that surface of the substrate which is remote from the semiconductor layer sequence, in particular proceeding from said surface, in the direction of the semiconductor layer sequence.

By means of the cutout and/or the beveled side surface, it is possible to increase the proportion of radiation which is generated in the semiconductor layer sequence and is coupled out directly, that is to say without (multiple) reflection in the substrate, from the substrate via the cutout and/or the side surface. The radiation power coupled out through the substrate and consequently the coupling-out efficiency of the optoelectronic semiconductor chip are thus advantageously increased. In this case, it has proved to be particularly suitable for the beveled side surface region to form an acute angle with the semiconductor layer sequence.

The substrate can taper with increasing distance from the semiconductor layer sequence, in particular in the beveled region of the beveled side surface. For this purpose, the side surface is expediently beveled in a suitable manner. The side surface can have a staircase-like structure or be curved in the region in which the substrate tapers and/or in the region of the cutout.

The beveling and/or the cutout can be produced in particular by means of a suitable separating tool, preferably shaped in accordance with the cutout and/or the beveling, e.g. a saw blade, in the course of singulating the chip from the wafer assemblage. The substrate can therefore be correspondingly sawn.

The cutout can be formed by means of the side surface region running obliquely with respect to the semiconductor layer sequence, and preferably by means of a further side surface region of this side surface. Preferably, the further side surface region is beveled at an angle with respect to the main extension direction but is different from that of the first-mentioned side surface region or runs substantially perpendicular to the semiconductor layer sequence and in particular the main extension direction. The further side surface region is preferably disposed downstream of the first-mentioned side surface region as seen from the semiconductor layer sequence.

In accordance with at least one embodiment, the substrate has a smaller cross section on the side remote from the semiconductor layer sequence than on the side facing the semiconductor layer sequence.

Preferably, the substrate has two side surfaces, wherein two side surface regions of these side surfaces, proceeding from that surface of the substrate which is remote from the semiconductor layer sequence, run in the direction of the semiconductor layer sequence substantially parallel, for example forming an angle of less than or equal to 5°, in particular less than or equal to 2°, or parallel to one another. Such a semiconductor chip can be grasped in a simplified manner at the side surfaces that run substantially parallel by means of a mounting tool, for example one for mounting the chip on an external connection conductor, for instance an external connection conductor for a wired radial component or a surface mountable component.

Furthermore, the substrate can have, on the part of the semiconductor layer sequence, a side surface region running substantially perpendicular, for example with a deviation of 5° or less, in particular 2° or less, from the right angle or perpendicular to the lateral main extension direction of the semiconductor layer sequence. This side surface region preferably merges into the cutout and/or the beveled side surface region. The beveled side surface region and/or the cutout is in other words preferably disposed downstream of the side surface region that runs perpendicular or substantially perpendicular, as seen from the semiconductor layer sequence.

In accordance with at least one embodiment, the semiconductor chip has a radiation-transmissive and electrically conductive contact layer. The coupling out of radiation from the semiconductor chip can be increased on account of the radiation transmissivity of this contact layer to radiation generated in the active region. The contact layer is expediently electrically conductively connected to the active region of the semiconductor layer sequence. Preferably, the contact layer adjoins the semiconductor chip, in particular over the whole area and/or directly.

In accordance with at least one embodiment, the contact layer contains a radiation-transmissive and electrically conductive oxide (TCO: Transparent Conducting Oxide), in particular a metal oxide, for example an indium tin oxide, such as InO, a tin oxide, such as $SnO_2$, an indium tin oxide (ITO), such as InSnO, or a zinc oxide, such as ZnO. Radiation-transmissive electrically conductive oxides are distinguished by high radiation transmissivity with at the same time high conductivity in a lateral direction. Via a, for example metallic or alloy-based, connection that is electrically conductively connected to the contact layer, current can be initiated into the contact layer over a comparatively small area. Said current can be homogeneously distributed laterally with low resistance in the contact layer and be injected into the semiconductor layer sequence over a large area.

A contact layer containing TCO can have a conductivity in a lateral direction of greater than or equal to 40 Ωsq, preferably greater than or equal to 100 Ωsq, particularly preferably greater than or equal to 200 Ωsq.

In order to increase the conductivity in a lateral direction, the contact layer can be doped. For example Al is suitable as a dopant for a zinc oxide, and Sb, for example, is suitable for a tin oxide.

For a high conductivity in a lateral direction, a contact layer containing TCO, in particular a contact layer containing an indium tin oxide, preferably has a substoichiometric composition, e.g. in the form of oxygen defects.

A contact layer containing ITO can furthermore comprise indium defects. The indium defects can be at least partly occupied by tin. Such an embodiment is particularly suitable for high conductivities in a lateral direction.

Preferably, the indium oxide proportion in a contact layer containing ITO is greater than the tin oxide proportion.

As a result of this, an n conduction type of the contact layer can be obtained overall in a simplified manner.

An ITO or a zinc oxide is particularly suitable for forming electrical contact with p-conducting semiconductor materials. A tin oxide is particularly suitable for forming contact with n-conducting semiconductor materials. By means of radiation-transmissive electrically conductive oxides it is possible to form a radiation-transmissive contact layer as a current spreading layer having a high transverse conductivity which facilitates a good, preferably barrier-free, electrical contact, in particular an ohmic contact, that is to say a contact having a substantially linear current-voltage characteristic, between the contact layer and the semiconductor layer sequence.

For impressing current homogeneously into the semiconductor layer sequence, the contact layer is expediently embodied as a continuous, in particular uninterrupted, layer. Furthermore, the contact layer covers over or covers the semiconductor layer sequence, if appropriate apart from an edge-side cutout having a small area, preferably completely.

Preferably, the contact layer is arranged on that surface of the semiconductor layer sequence which is remote from the substrate, and/or the contact layer adjoins a p-conducting semiconductor layer of the semiconductor layer sequence.

In accordance with at least one embodiment, a tunnel contact is formed between the contact layer and the active region. The tunnel contact can be arranged in particular between the contact layer and the active region. The tunnel contact preferably has one or a plurality of, in particular doped, tunnel contact layers monolithically integrated into the semiconductor layer sequence.

A tunnel contact layer of the tunnel contact preferably adjoins the contact layer, in particular directly. By means of a tunnel contact layer between the active region and the contact layer, it is possible to reduce the voltage drop ("loss voltage") at the junction of contact layer/semiconductor layer sequence by comparison with a semiconductor chip in which a tunnel contact layer is dispensed with, during operation of the semiconductor chip. The tunnel contact layer preferably has a conduction type that is different from a semiconductor layer of the semiconductor layer sequence which adjoins the tunnel contact. If said semiconductor layer is embodied in p-conducting fashion, for example, then the tunnel contact layer is embodied in n-conducting fashion. The tunnel contact layer preferably directly adjoins the contact layer. For a predetermined operating voltage of the semiconductor chip, the electrical power converted into radiation power in the active region can be increased on account of the voltage loss reduced by means of the tunnel contact.

The tunnel contact layer preferably has a thickness of 30 nm or less, particularly preferably 20 nm or less. Furthermore, the thickness of the tunnel contact layer is preferably greater than or equal to 3 nm. Such thicknesses have proved to be particularly advantageous.

The tunnel contact preferably comprises a further tunnel contact layer. The voltage loss during the operation of the semiconductor chip can be more extensively reduced by means of the further tunnel contact layer.

The further tunnel contact layer, with regard to the thickness, is preferably embodied in accordance with the thickness ranges specified for the above tunnel contact layer.

If the tunnel contact comprises a plurality of tunnel contact layers, then two tunnel contact layers monolithically integrated into the semiconductor layer sequence preferably have different conduction types.

The further tunnel contact layer preferably has the same conduction type as the semiconductor layer of the semiconductor layer sequence which adjoins the tunnel contact, in particular the further tunnel contact layer, on the part of the active region. By way of example, the further tunnel contact layer is embodied in p-conducting fashion for this purpose.

A doped tunnel contact layer is preferably embodied in highly doped fashion (p$^+$or n$^+$). A dopant concentration in the tunnel contact layer can for this purpose be $1*10^{19}$ cm$^{-3}$ or more, preferably $1*10^{20}$ cm$^{-3}$ or more.

The tunnel contact is furthermore preferably embodied with two monolithically integrated tunnel contact layers of different conduction types as a tunnel diode.

A tunnel contact is particularly expedient when the potential barrier between the contact layer and the semiconductor layer sequence without an interposed tunnel junction, such as for instance in the case of a crucially blocking pn junction between the contact layer and the semiconductor layer sequence, is comparatively high.

Such a blocking pn junction which significantly impedes the entrance of charge carriers into the semiconductor layer sequence or significantly contributes to the loss voltage can form between an n-conducting TCO, for instance n-conducting ITO, for the contact layer and a p-conducting semiconductor layer directly adjoining said contact layer, for instance a layer based on nitride compound semiconductors, of the semiconductor layer sequence.

By means of the tunnel contact, an electrical contact with a comparatively low voltage loss between the contact layer and the semiconductor layer sequence, in particular a contact having an ohmic current-voltage characteristic, can be produced in a simplified manner.

In accordance with at least one embodiment, an interlayer is arranged between the tunnel contact layer and the active region. The interlayer is preferably embodied in undoped fashion. The interlayer can be formed as a barrier layer that impedes or completely blocks a diffusion of a dopant from the tunnel contact layer through the barrier layer or through the barrier layer into the tunnel contact layer. By way of example, the interlayer can serve as a barrier layer for an acceptor, e.g. Mg, with which a semiconductor layer arranged on that side of the semiconductor layer sequence which is remote from the tunnel contact layer, in particular on that side of the interlayer which is remote from the tunnel contact layer, is doped.

A diffusion of dopants into the tunnel contact layer, in particular from a region of the semiconductor layer sequence having a conduction type that is different from the conduction type of the tunnel contact layer, can reduce the current-carrying capacity of the tunnel contact layer and thereby that of the chip and consequently (concomitantly) cause a failure of the chip during regular operation. The interlayer is preferably integrated in the tunnel contact and particularly preferably arranged between two tunnel contact layers having different conduction types. The interlayer is preferably formed as a barrier layer that impedes the penetration of a corresponding dopant from the further tunnel contact layer mentioned further above into the tunnel contact layer.

Furthermore, the interlayer preferably has a thickness of 10 nm or less.

A tunnel contact layer of the tunnel contact can, if appropriate, also be embodied as a multilayer structure, e.g. as a superlattice structure.

As an alternative to providing a tunnel contact having two tunnel contact layers of different conduction types, a good electrical contact, preferably an ohmic contact, between the contact layer and the semiconductor body can, if appropriate, also be formed without a tunnel contact.

In particular, for this purpose, a connection layer adjoining the radiation-transmissive contact layer can be arranged in the semiconductor body. Said connection layer is expediently optimized for forming contact with the radiation-transmissive contact layer. The connection layer is preferably embodied in doped fashion. For forming contact with the contact layer, it has proved to be particularly advantageous for the connection layer to have, on the side facing the contact layer and in particular in the contact region in which the connection layer adjoins the contact layer, a different dopant concentration than in a region of the connection layer which is arranged further away from the contact layer and in particular nearer to the active region. Preferably, the dopant concentration in the connection layer is higher on the part of the contact layer than on the part of the active region.

The different dopant concentrations in the connection layer can deviate in particular significantly from one another. A deviation of the two dopant concentrations from one another is preferably 30% or more, particularly preferably 40% or more. The dopant concentration in the connection layer can therefore be, in the region near the contact layer, in particular in the direct contact region, 1.3 times or more, preferably 1.4 times or more, the dopant concentration in a region of the connection layer that is further away from the contact layer and is arranged nearer to the active region.

The connection layer preferably contains a nitride compound semiconductor material. The connection layer can contain or consist of GaN, for example. Furthermore, the connection layer is preferably embodied such that it is doped in p-conducting fashion. It has proved to be particularly suitable to use Mg as acceptor for the p-doping.

A dopant concentration in the connection layer of $3*10^{19}$ cm$^{-3}$ or more, e.g. of between $3*10^{19}$ cm$^{-3}$ and $5*10^{20}$ cm$^{-3}$ inclusive, has proved to be particularly suitable for a low contact resistance between the contact layer and the connection layer. In a region of the connection layer that is remote from the contact layer, said connection layer can have a dopant concentration of $2*10^{19}$ cm$^{-3}$ or less. In the case of a dopant concentration that is reduced within the connection layer by comparison with the boundary region with respect to the contact layer, the concentration of free charge carriers in the connection layer and thus the conductivity in the direction of the active region can be higher than in the case of a dopant concentration that is uniformly high over the layer course, in particular perpendicular to the lateral main extension direction. A high dopant concentration in the contact region with respect to the contact layer makes it easier, however, to form a low-resistance, and hence low-loss, electrical contact of the contact layer with respect to the active region. In particular, an ohmic electrical contact with the semiconductor body can thus be obtained in a simplified manner.

A thickness of the connection layer can be 30 nm or more, particularly preferably 50 nm or more, or even 100 nm or more.

In accordance with at least one embodiment, the semiconductor chip has an electrical connection, which is preferably electrically conductively connected to the radiation-transmissive and electrically conductive contact layer. The connection can be formed as a bonding pad, that is to say as provided for making contact with a bonding wire. Preferably, the connection contains a metal, for example Au. The connection can be embodied in particular in metallic fashion or in an alloy-based manner. The connection is expediently electrically conductively connected to the active region.

Preferably, the electrical connection of the semiconductor chip is arranged on that side of the semiconductor layer sequence which is remote from the substrate, and/or on that side of the contact layer which is remote from the semiconductor layer sequence.

In accordance with at least one embodiment, a reflector layer is arranged between the electrical connection and the semiconductor layer sequence, in particular between the contact layer and the connection. The reflector layer preferably contains a metal, for example Al or Ag. These metals are distinguished by particularly high reflectivities for shortwave radiation. The reflector layer is preferably embodied in metallic fashion or in an alloy-based manner.

The absorption of radiation in the connection can be reduced by means of the reflector layer. Rather, the radiation can be reflected back into the semiconductor layer sequence by means of the reflector layer and be coupled out from the semiconductor chip, instead of possibly being absorbed in the connection. As a result of this, it is possible to increase the coupling-out efficiency of the semiconductor chip, that is to say the ratio of the radiation power generated in the semiconductor chip to the radiation power coupled out from the semiconductor chip.

In accordance with at least one embodiment, an adhesion promoting layer is arranged between the connection and the contact layer, preferably between the reflector layer and the contact layer. The adhesion promoting layer preferably increases the adhesion of the connection and/or of the reflector layer to the semiconductor chip, in particular the adhesion of the reflector layer to the contact layer.

The adhesion promoting layer preferably contains a metal, for example Pd or Pt, and is particularly preferably embodied in metallic fashion or in an alloy-based manner.

The adhesion promoting layer is preferably embodied in transparent or semitransparent fashion in order that the radiation power absorbed in the adhesion promoting layer is kept advantageously low. A thickness of the adhesion promoting layer is preferably less than 3 nm, particularly preferably less than 1 nm. The adhesion promoting layer can be embodied in particular in insular fashion, preferably with a plurality of adhesion promoting islands. A continuous layer is not necessary for the adhesion promotion.

In accordance with at least one embodiment, the semiconductor chip is embodied as a luminescence diode, for instance as a light-emitting diode or as a laser diode, wherein the embodiment of a volume emitter is of course particularly expedient for a light-emitting diode.

In accordance with at least one embodiment, the semiconductor chip comprises an electrical counter-connection, which is preferably electrically conductively connected to the active region. Electrical contact can be made with the semiconductor chip by means of the electrical connection and the electrical counter-connection. The counter-connection preferably contains a metal and is particularly preferably embodied in metallic fashion or in an alloy-based manner.

Furthermore the connection and the counter-connection are preferably arranged on opposite sides of the semiconductor layer sequence. The semiconductor chip can accordingly be embodied with a structure that is conductive in the vertical direction between the connection and the counter-connection. This facilitates simple and reliable mounting of the semiconductor chip on an external connection conductor.

By comparison with an arrangement of both connections on the same side of the semiconductor layer sequence, a smaller chip grid can thus be chosen during the production of the semiconductor chips, whereby—from a semiconductor layer structure of a semiconductor wafer—it is possible to obtain a higher number of semiconductor layer sequences for individual semiconductor chips than in the case of a semiconductor chip in which the connection and the counter-connection are arranged on the same side of the semiconductor layer sequence. The latter arrangement of the connections requires a semiconductor layer sequence having a larger area for the individual chip on account of the connection arrangement. By means of an arrangement of the connections on different sides of the semiconductor layer sequence, it is possible to reduce the area of the semiconductor layer sequence by comparison. The yield of semiconductor chips from a semiconductor wafer is consequently increased.

Preferably, the electrical counter-connection of the semiconductor chip is arranged on that surface of the substrate which is removed from the semiconductor layer sequence. For electrically conductively connecting the counter-connection to the active region, the substrate is expediently embodied in electrically conductive fashion. If appropriate, the substrate can be doped suitably for this purpose, for instance in the form of a nitrogen-doped SiC substrate.

Such a counter-connection facilitates the electrically conductive connection, for example by means of adhesive bonding or soldering, of the chip to an external connection conductor, for example for an optoelectronic component, for instance a radial component or a surface mountable component. A surface mountable component can be mounted on an external component carrier, for instance a printed circuit board, in a particularly simple and space-saving manner. By means of an arrangement of the counter-connection and the connection of the chip on different sides of the semiconductor layer sequence, a possibly additional wire bonding can be dispensed with since one of the connections, preferably the counter-connection, can be electrically conductively connected and in particular fixed to an external connection conductor without a wire connection but rather by means of a connecting layer, for instance a solder or adhesive layer.

In accordance with at least one embodiment, the substrate, on the side remote from the semiconductor layer sequence, is provided completely or partly with a mirror layer. The mirror layer preferably contains a metal, e.g. Al or Ag, and is particularly preferably embodied in metallic fashion or in an alloy-based manner. The mirror layer can be applied in particular to the substrate, for example applied by sputtering or vapor deposition. Radiation can be reflected back into the substrate by means of the mirror layer. Absorption losses in an external connection conductor are thus advantageously reduced. Furthermore, the radiation power passing through that surface of the substrate which faces the semiconductor layer sequence and in particular the radiation power coupled out via said surface can be increased. The mirror layer can be arranged between the counter-connection and the substrate or laterally alongside the counter-connection.

Preferably, a side surface of the substrate is partly or completely mirror-coated. By way of example, the cutout and/or the beveled side surface region can be partly or completely mirror-coated.

The mirror layer provided on that side of the substrate which is remote from the semiconductor layer sequence can extend in particular as a continuous layer along the beveled side surface region of the side surface of the substrate and/or along the cutout.

In accordance with at least one embodiment, a surface of the substrate, in particular that surface of the substrate which faces the semiconductor layer sequence, that surface of the semiconductor layer sequence which faces the contact layer, and/or that surface of the contact layer which is remote from the semiconductor layer sequence, has elevations and depressions. The elevations and depressions can be formed by means of a regular, in particular a preferably periodically occurring, structure or an irregular roughening. Such structures can be formed for example by means of etching, preferably using a suitable mask, or sandblasting. By way of example, dry etching, e.g. reactive ion etching (RIE), preferably using a metal mask, or wet-chemical etching without the use of a mask, is suitable for an irregular roughening, while wet-chemical etching using a suitable mask is particularly suitable for a regular structure. A structured surface can, if appropriate, also be formed by means of sandblasting.

In accordance with at least one embodiment, the semiconductor layer sequence, in particular the active region, the interlayer and/or the tunnel contact layer or the tunnel contact layers, contains a nitride compound semiconductor material.

In accordance with at least one embodiment, the reflector layer and/or the mirror layer is embodied in electrically conductive fashion. Preferably, the reflector layer and/or the mirror layer is electrically conductively connected to the active region, the connection and/or the counter-connection.

In accordance with at least one embodiment, the ratio of the area content in that surface of the substrate which faces the semiconductor layer sequence or that surface of the semiconductor layer sequence which faces the substrate to the area content in a side surface that laterally delimits the semiconductor chip, in particular a side surface of the substrate, is less than or equal to 2, preferably less than or equal to 1.5, particularly preferably less than or equal to 1.2. For predetermined edge lengths of the chip, such ratios can be obtained by means of a substrate having a suitably embodied thickness.

Preferably, the side surface in this context is embodied in unbeveled fashion and without any cutouts. The side surface preferably runs substantially perpendicular, for example with a deviation of 5° or less, preferably 2° or less, from the right angle, or perpendicular to the lateral main extension direction of the semiconductor layer sequence and/or to that surface of the substrate which faces the semiconductor layer sequence.

A semiconductor chip of this type can have a substantially parallelepipedal enveloping basic form. A parallelepipedal chip mounted on an external connection conductor is preferably mounted on the connection conductor in such a way that the longer sides extend away from the connection conductor ("pillar-like" mounting).

In an embodiment of the chip with the area content ratios specified above, the side surface in comparison with the chip surface in a plan view of the semiconductor chip is preferably embodied with a similar area content or with a larger area. The radiation coupling-out area made available via the side surface is thereby advantageously formed in a large fashion. Consequently, the luminance at this side surface is advantageously reduced.

For the area content in that surface of the substrate which faces the semiconductor layer sequence or that surface of the semiconductor layer sequence which faces the substrate, if appropriate the content of the area covered by said surface in a lateral direction can be used, for instance in the case of a patterning of the respective surface.

Such an embodiment of the chip is particularly advantageous for multiply wave-guiding substrates having a high refractive index, such as an SiC substrate, since an increased radiation power can couple out from a substrate side surface on account of the wave guiding in the substrate. The luminance can be reduced in a simplified manner on account of the large-area embodiment of the side surface. For coupling out radiation from the chip, the side surface is expediently embodied such that it is not mirror-coated.

As the substrate thickness increases, however, the total height of the semiconductor chip also increases, in particular in the mounting position. With increasing height and with lateral dimensioning remaining the same, reliable mounting of the semiconductor chip on a connection conductor is made more difficult. In particular, there is an increased risk of the semiconductor chip tipping over upon arrangement on the connection conductor on account of the chip's center of gravity that shifts away from the mounting area upward with increasing height.

In accordance with at least one embodiment, the area content ratio designated above is greater than or equal to 0.5, preferably greater than or equal to 0.7, particularly preferably greater than or equal to 0.8. The risk of the chip tipping over upon arrangement on a connection conductor can thus be reduced.

An area ratio of between 0.8 and 1.2 inclusive has proved to be particularly suitable both for a low luminance at the side surfaces and for high mounting reliability. Such a ratio can be obtained by means of a chip having a cube-like enveloping basic form.

It should be noted that the side surface of the substrate can, if appropriate, advantageously be formed with a large area alternatively or additionally also by way of the ratio of the thickness of the substrate to an edge length of the chip, for instance the largest or the smallest edge length of the chip. In particular, the area content ratios specified above can be obtained in this way. Preferably, the ratio of the respective chip edge length to the thickness of the substrate for this purpose fulfils the relations specified above. Furthermore, the thickness of the substrate is preferably constant in a lateral direction.

Radiation reflected at a mirror layer preferably provided on that side of the substrate which is remote from the semiconductor layer sequences is also coupled out multiply via the side surface of the substrate in the case of a thick embodiment of the substrate or an embodiment of the area contents in accordance with the explanations above. The volume radiation property of the semiconductor chip can thus be intensified. This is of particular importance for a semiconductor layer sequence based on nitride compound semiconductors on a substrate having a higher refractive index by comparison, for instance a substrate containing SiC. In such a semiconductor chip, radiation during transfer from the semiconductor layer sequence into the substrate, on account of the refractive index relation, is predominantly refracted toward the surface normal to the interface with the substrate and thus generally away from the side surface. The radiation power impinging on the mirror layer is thus increased by comparison with a substrate having a low refractive index, e.g. a sapphire substrate. On account of the comparatively thick embodiment of the substrate, the radiation power reflected at the mirror layer and coupled out via the side surface of the substrate can be increased.

Furthermore, a plurality of side surfaces of the substrate, in particular all the side surfaces of the substrate, can fulfill the above relations.

In accordance with at least one embodiment, a thickness of the substrate is less than or equal to half an edge length of the semiconductor chip, in particular less than half an edge length of the substrate. The thickness of the substrate is preferably the maximum thickness. Furthermore, the thickness of the substrate is preferably constant in a lateral direction.

Preferably, the thickness of the substrate is less than a third of the edge length of the semiconductor chip. For this purpose, the substrate can be suitably thinned, for example etched away or ground away.

A minimum or in particular maximum edge length of the chip, in particular in a lateral direction, can be used as the edge length.

On account of the relatively thin substrate, only a comparatively small proportion of radiation impinges directly from the semiconductor layer sequence on the correspondingly small-area side surface of the substrate, such that the luminance at the side surfaces can advantageously be reduced.

This is particularly expedient in combination with a mirror layer on that side of the substrate which is remote from the semiconductor layer sequence by means of which, as described further above, radiation can be reflected back in the direction of the semiconductor layer sequence and, in particular, through a radiation-transmissive contact layer.

By comparison with a chip having a comparatively thick substrate (cf. the explanations above), such a chip is moreover reliably mountable in a simplified manner. In particular, the risk of the chip tipping over is reduced. When electrical contact is made with the semiconductor chip through the substrate, such a "thin" chip furthermore has an advantageously low forward voltage.

A substrate having a high refractive index by comparison with the semiconductor layer sequence, for instance an SiC substrate, is particularly suitable with regard to reducing the luminance at the side surfaces. As already mentioned further above, beams upon passing over into the substrate having a high refractive index are multiply refracted away from the side surface. The luminance at the side surface can thus be reduced.

In a particularly advantageous embodiment, the semiconductor chip comprises a semiconductor layer sequence having an active region suitable for generating radiation and a lateral main extension direction, wherein the semiconductor layer sequence is arranged on a substrate and the semiconductor chip has a radiation-transmissive and electrically conductive contact layer.

In a first variant of this configuration, the substrate has a side surface having a side surface region that is beveled with respect to the main extension direction, and/or a cutout.

In a second variant of this configuration, the refractive index of the substrate is greater than or equal to the refractive index of the active region, and/or the refractive index of the substrate is greater than or equal to the refractive index of a semiconductor layer terminating the semiconductor layer sequence on the side facing the substrate.

In a third variant of this configuration, the semiconductor layer sequence contains a nitride compound semiconductor material, and an electrical connection of the semiconductor chip and also an electrical counter-connection are arranged on opposite sides of the semiconductor layer sequence.

With a semiconductor chip in accordance with these variants, it is possible to obtain an increase in the coupling-out efficiency of the semiconductor chip to a considerable extent. The advantages of the individual features are explained in more detail above and can be manifested to an intensified extent through the corresponding combinations.

BRIEF DESCRIPTION OF THE DRAWINGS

Further features, advantageous embodiments and expediencies of the invention will become apparent from the following description of the exemplary embodiments in conjunction with the figures.

FIG. 3 shows a schematic sectional view of a further exemplary embodiment of an optoelectronic semiconductor chip, FIG. 4 shows a schematic sectional view of a further exemplary embodiment of an optoelectronic semiconductor chip.

DETAILED DESCRIPTION OF THE DRAWINGS

Elements that are identical, of identical type and act identically are provided with identical reference symbols in the figures.

The optoelectronic semiconductor chip 1 comprises, in accordance with the exemplary embodiments according to FIGS. 1 to 7C, in each case a semiconductor layer sequence 2, which comprises an active region 3 suitable for generating radiation and has a lateral main extension direction D. For efficiently generating radiation, the active region 3 is preferably embodied as a single or multiple quantum well structure.

Figure 6:
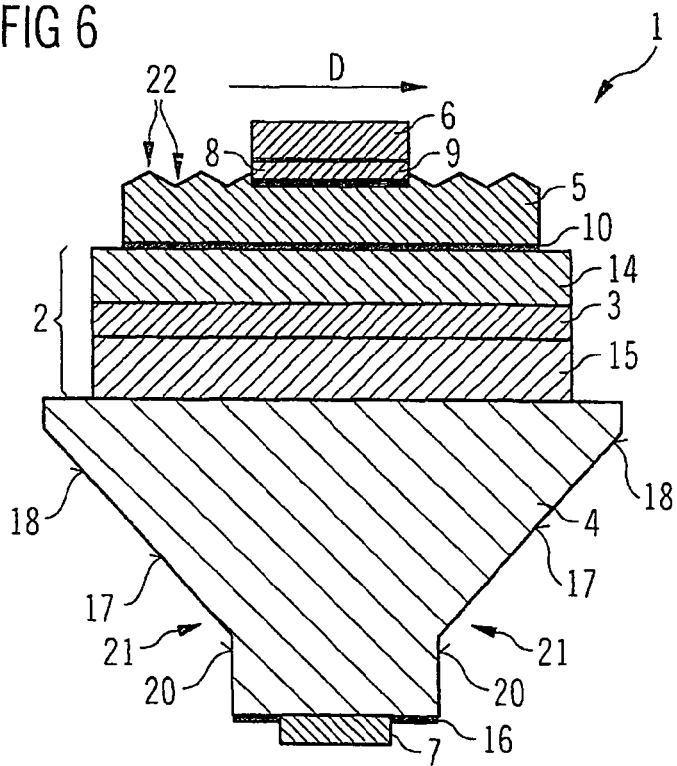
FIG. 6 shows a schematic sectional view of a further exemplary embodiment of an optoelectronic semiconductor chip.
Figure 7C:
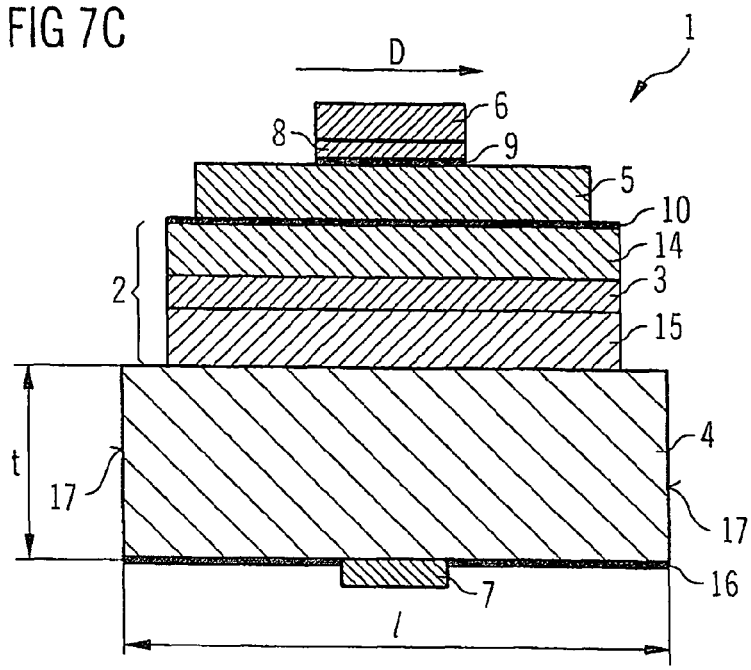
FIG. 7A shows a schematic sectional view of a further exemplary embodiment of an optoelectronic semiconductor chip, and two variants of this exemplary embodiment are shown in FIGS. 7B and 7C.
Figure 8:
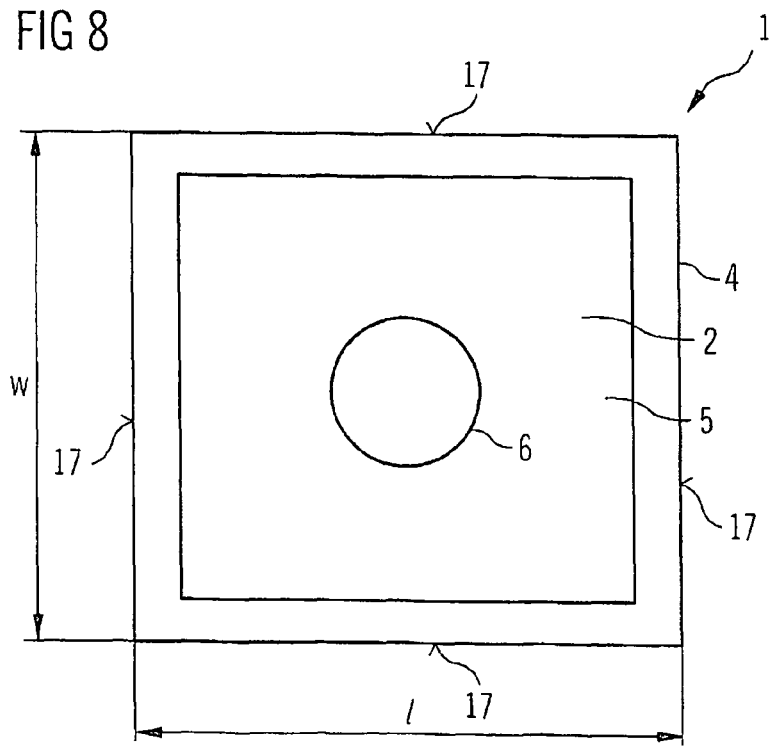
FIG. 8 shows a schematic plan view of an exemplary embodiment of an optoelectronic semiconductor chip.

The semiconductor chips shown in FIGS. 1 to 7C can be embodied in plan view in accordance with the plan view shown in FIG. 8.

The semiconductor layer sequence 2 is arranged on a substrate 4. The substrate 4 is preferably formed from the growth substrate on which the semiconductor layer sequence 2 is grown epitaxially. The substrate 4 mechanically stabilizes the semiconductor layer sequence 2 and carries the latter. The substrate can additionally be thinned, for example by means of grinding away or etching.

Furthermore, the semiconductor chip 1 comprises a radiation-transmissive and electrically conductive contact layer 5, preferably applied to the prefabricated semiconductor layer sequence. The contact layer 5 is arranged on that side of the semiconductor layer sequence 2 which is remote from the substrate 4. Preferably, the contact layer 5 adjoins the semiconductor layer sequence 2 directly, in particular over the whole area. The contact layer 5 is electrically conductively connected to the active region 3. Furthermore, the contact layer 5 is preferably embodied as a continuous, uninterrupted layer. Furthermore, the contact layer 5 preferably extends substantially over the whole area apart from edge-side cutouts along the lateral main extension direction over the semiconductor layer sequence 2.

The contact layer 5 can be deposited for example by means of a PVD method, e.g. by means of vapor deposition, preferably using an electron beam (E-beam evaporation), or sputtering from the semiconductor layer sequence. These methods are particularly suitable for an ITO contact layer. A CVD method, in particular a PECVD method (PECVD: Plasma Enhanced Chemical Vapor Deposition), can also be suitable for the deposition of the contact layer, in particular for a ZnO contact layer.

The semiconductor layer sequence 2 is arranged between an electrical connection 6 and an electrical counter-connection 7, which are arranged on different sides of the semiconductor layer sequence 2 and expediently electrically conductively connected to the active region 3. The electrical connection 6 is arranged on that side of the contact layer 5 which is remote from the semiconductor layer sequence 2, and is electrically conductively connected to the contact layer. The counter-connection 7 is arranged on that side of the substrate 4 which is remote from the semiconductor layer sequence 2.

The connection 6 is preferably embodied as a bonding pad and accordingly provided for electrically conductive connection to a bonding wire by means of which the semiconductor chip 1 can be connected to an external connection conductor, for instance a connection conductor of a housing for a radial component or a surface mountable component. The electrical connection 6 is preferably embodied with a small area compared with the contact layer 5. In particular, the electrical connection 6 preferably covers a singly contiguous region of the contact layer 5. The electrical connection 6 can be embodied for example substantially in circular fashion in plan view (cf. plan view in FIG. 8).

The electrical counter-connection 7 is preferably provided for electrically conductive connection to a further external connection conductor by means of an electrically conductive connecting layer, for example a solder layer or an adhesive layer. Furthermore, the electrical counter-connection can completely (not explicitly illustrated) or partly cover that side of the substrate which is remote from the semiconductor layer sequence.

By means of such an arrangement of the connections 6 and 7 on different sides of the semiconductor layer sequence, compared with an arrangement of the connections on the same side of the semiconductor layer sequence, in particular the side remote from the substrate, a smaller chip grid can be chosen in a simplified manner for semiconductor chips having an identical radiation power to be coupled out. Moreover, a further wire bond can be dispensed with on account of the connecting layer.

A reflector layer 8 is arranged between the active region 3 and the electrical connection 6. The reflector layer 8 is expediently embodied such that it is reflective to radiation generated in the active region. The reflector layer 8 is preferably arranged between the semiconductor layer sequence 2 and the electrical connection 6 and in particular between the contact layer 5 and the electrical connection 6.

An adhesion promoting layer 9 is arranged between the electrical connection 6 and the active region 3. The adhesion promoting layer 9 is arranged between the reflector layer 8 and the semiconductor layer sequence 2 and in particular between the reflector layer 8 and the contact layer 5. Preferably, the adhesion promoting layer 9 directly adjoins the reflector layer 8, on the one hand, and the contact layer 5, on the other hand. The adhesion of the reflector layer 8 to the contact layer 5 can be increased by means of the adhesion promoting layer 9.

Furthermore, a tunnel contact 10 is arranged between the contact layer 5 and the active region 3. The tunnel contact 10 is preferably embodied such that it is monolithically integrated in the semiconductor body. Preferably, the tunnel contact 10 comprises a first tunnel contact layer 11 and a second tunnel contact layer 12 (cf. the excerpt explicitly illustrated by way of example only in connection with FIG. 7A).

The tunnel contact layers 11 and 12 preferably have different conduction types (n-conducting and p-conducting, respectively). Particularly preferably, the tunnel contact layers are doped differently for this purpose. The tunnel contact layer 12 preferably has the same conduction type as a semiconductor layer 13 of the semiconductor layer sequence 2 that adjoins the tunnel contact 10 on the part of the active region 3, for example p-conducting. The tunnel contact layers 11, 12, are preferably embodied such that they are highly doped. The tunnel contact layer 12 is preferably embodied in p-conducting fashion, and the tunnel contact layer 11 is preferably embodied in n-conducting fashion. A dopant concentration of $1*10^{19}$ 1/cm$^3$ or greater, preferably $1*10^{20}$ 1/cm$^3$ or greater, has proved to be particularly suitable for the tunnel contact layers. By means of the tunnel contact it is possible to improve the electrical linking of the contact layer 5, which preferably directly adjoins the tunnel contact, to the active region. A contact having a low voltage loss, in particular an ohmic contact between the contact layer 5 and the semiconductor layer sequence 2 can be realized in a simplified manner by means of the tunnel contact.

The thickness of the tunnel contact layers preferably lies between in each case 3 nm and 20 nm inclusive.

The active region 3 is preferably arranged between semiconductor layer(s) 14 and 15 having different conduction types. The semiconductor layer(s) 14 can be embodied for example in p-conducting fashion and the semiconductor layer(s) 15 can be embodied for example in n-conducting fashion. The semiconductor layer(s) 14 and 15 can in particular have in each case a barrier or cladding layer by means of which the charge carrier component in the active region is improved. The internal quantum efficiency of the semiconductor chip can be increased by means of this.

In addition to the tunnel contact layers 11, 12, the tunnel contact 10 can have an undoped interlayer arranged between said layers (not explicitly illustrated). The said interlayer is preferably formed as a diffusion barrier layer and impedes the diffusion of an acceptor, e.g. Mg, from the p-conducting second tunnel contact layer 12 or the p-conducting semiconductor layer(s) 14 into the n-conducting first tunnel contact layer 11 or completely blocks such a diffusion. The risk of damage to the chip caused by the diffusion of the dopant can thus be reduced.

Furthermore, one tunnel contact layer 11 or 12 or a plurality of tunnel contact layers can be embodied as a multilayer structure, for instance as a superlattice structure (not explicitly illustrated).

The interlayer preferably has a thickness of 10 nm or less. If appropriate, a thickness of the interlayer of one monolayer can already suffice for a diffusion barrier.

A mirror layer 16 is arranged on that surface of the substrate 4 which is remote from the semiconductor layer sequence 2. The mirror layer 16 can be applied for example to the substrate, for example applied by sputtering or vapor deposition. Furthermore, the mirror layer 16 can be arranged between the counter-connection 7 and the substrate 4 or laterally alongside the counter-connection.

The semiconductor layer sequence 2 is preferably based on nitride compound semiconductor materials. Such materials, as already mentioned further above, are particularly suitable for generating short-wave radiation. In particular, the tunnel contact layers 11 and 12, the semiconductor layer(s) 13, 14 and 15 and also the active region 3 preferably contain a material from the material system $Al_nGa_mIn_{1-n-m}N$. The active region preferably contains InGaN. The first tunnel contact layer 11 and/or the second tunnel contact layer 12 can contain or consist of GaN, AlGaN, InGaN or InAlGaN. The interlayer can contain or consist of AlN, GaN, AlGaN, InGaN or InAlGaN.

The electrical connection 6, the electrical counter-connection 7, the reflector layer 8, the adhesion promoting layer 9 and/or the mirror layer 16 preferably contain a metal and are particularly preferably embodied in a metallic fashion or in an alloy-based manner. By way of example, Au is suitable for the connections 6 and 7, and Al or Ag is particularly suitable for the reflector layer 8, in particular for high reflectivities for radiation which can be generated by means of nitride compound semiconductors. The same correspondingly applies to the reflective mirror layer 16. The adhesion promoting layer 9 preferably contains Pt or Pd. Such materials are particularly suitable for the adhesion promotion with respect to the semiconductor chip.

A thickness of the adhesion promoting layer is preferably less than or equal to 1 nm. The adhesion promoting layer can be embodied in particular in insular fashion.

The radiation-transmissive and electrically conductive contact layer 5 preferably contains a TCO material, for example ZnO:Al or an ITO. What is particularly suitable for a particularly high transverse conductivity of an n-conducting ITO is an ITO in substoichiometric composition, e.g. having oxygen defects, or an ITO having a ratio of indium oxide to tin oxide of 90:10 or greater, e.g. 95:5.

A thickness of the contact layer preferably lies between 100 nm and 1000 nm inclusive, with regard to simultaneously good current spreading and economic use of material particularly preferably between 100 nm and 300 nm inclusive.

Via the connection 6 embodied with a comparatively small area, the reflector layer 8 and the adhesion promoting layer 9, current is injected into the contact layer 5 in a comparatively small injection region. Said current is distributed in a lateral direction in the TCO contact layer on account of the high transverse conductivity. The active region 3 can thus be energized homogeneously and over a large area despite the comparatively small-area electrical connection 6. At the same time, TCO materials are distinguished by high radiation transmissivity, such that radiation generated in the active region can radiate through the contact layer in a simplified manner in contrast to a contact metallization applied over a comparatively large area.

Since the lateral current distribution is effected by means of the contact layer 5, the possibly absorbent connection 6 can advantageously be embodied with a small area.

Absorption in the electrical connection 6 of radiation generated in the active region 3 is reduced by means of the reflector layer 8. The reflector layer 8 reflects radiation impinging on it from the active region 3 preferably back into the semiconductor layer sequence 2, such that the radiation can be coupled out if appropriate from the semiconductor chip 1. The adhesion of the reflector layer 8 to the contact layer 5 is advantageously increased by means of the adhesion promoting layer 9, thereby reducing the risk of a detachment of the layer stack comprising the connection and the reflector layer from the contact layer and hence the risk of a chip defect.

Radiation which is generated in the active region 3 and which impinges on that surface of the substrate 4 which is remote from the semiconductor layer sequence 2 can be reflected back in the direction of the semiconductor layer sequence by means of the mirror layer 16, thereby reducing the risk of absorption of radiation generated in the semiconductor chip 1 in elements arranged on that side of the mirror layer 16 which is remote from the semiconductor layer sequence 2, for instance an external connection conductor or else the counter-connection 7.

The electrical linking of the contact layer to the semiconductor layer sequence is preferably improved by means of the tunnel contact 10. In particular, the loss voltage at the junction of contact layer/semiconductor layer sequence can be reduced. This is of particular importance if a high potential barrier having a significant thickness would form between the contact layer 5 and the semiconductor layer(s) 14 in the absence of a tunnel contact. This can be the case for example with n-conducting ITO or ZnO:Al.

As an alternative to providing a tunnel contact 10 having two tunnel contact layers of different conduction types, a good electrical contact, preferably an ohmic contact, between the contact layer 5 and the semiconductor body 2 can if appropriate also be formed without a tunnel contact.

In particular, for this purpose a connection layer adjoining the radiation-transmissive contact layer can be integrated in the semiconductor body. In this case, the layer 11 of the tunnel contact (cf. FIG. 7A) can be dispensed with and the layer 12 can serve as connection layer.

The said connection layer is expediently optimized for forming contact with the radiation-transmissive contact layer. The connection layer is preferably embodied in doped fashion. For forming contact with the contact layer, it has proved to be particularly advantageous for the connection layer to have, on the side facing the contact layer and in particular in the contact region in which the connection layer adjoins the contact layer, a different dopant concentration than in a region of the connection layer which is arranged further away from the contact layer and in particular nearer to the active region. Preferably, the dopant concentration in the connection layer is greater on the part of the contact layer than on the part of the active region.

The different dopant concentrations in the connection layer can in particular deviate significantly from one another. A deviation of the two dopant concentrations from one another is preferably 30% or more, particularly preferably 40% or more. The dopant concentration in the connection layer, in the region near the contact layer, in particular in the direct contact region, can amount to 1.3 times or more, preferably 1.4 times or more, the dopant concentration in a region of the connection layer that is further away from the contact layer and is arranged nearer to the active region.

The connection layer preferably contains a nitride compound semiconductor material. The connection layer can contain or consist of GaN, for example. Furthermore, the connection layer is preferably embodied such that it is doped in p-conducting fashion. It has proved to be particularly suitable to use Mg as an acceptor for the p-type doping.

A dopant concentration in the connection layer on the part of the contact layer of $3*10^{19}$ cm$^{-3}$ or more, e.g. of between $3*10^{19}$ cm$^{-3}$ and $5*10^{20}$ cm$^{-3}$ inclusive, has proved to be particularly suitable for a low contact resistance between the contact layer and the connection layer. In a region of the connection layer that is remote from the contact layer, said connection layer can have a dopant concentration of $2*10^{19}$ cm$^{-3}$ or less. In the case of a dopant concentration that is reduced in the interior of the connection layer by comparison with the boundary region with respect to the contact layer, the concentration of free charge carriers in the connection layer and thus the conductivity in the direction of the active region can be higher than in the case of a dopant concentration that is uniformly high over the course of the layer, in particular perpendicular to the lateral main extension direction. However, a high dopant concentration in the contact region with respect to the contact layer makes it easier to form a low-resistance and hence low-loss electrical contact between the contact layer and the active region. In particular, an ohmic electrical contact with the semiconductor body can thus be obtained in a simplified manner.

A thickness of the connection layer can be 30 nm or more, particularly preferably 50 nm or more or even 100 nm or more.

Such a connection layer is described in WO 03/043092, the entire disclosure content of which is incorporated herein by reference. It has surprisingly been found that a connection layer formed in this way is particularly suitable not only for forming contact between highly absorbent metallizations and semiconductor materials, but also for forming electrical contact between a semiconductor body and a radiation-transmissive contact layer, in particular a TCO contact layer.

The substrate 4 contains for example SiC, preferably SiC: N, or, preferably n-conductively doped, GaN. In particular, the substrate 4 is preferably embodied in electrically conductive fashion, such that electrical contact can be made with the active region 3 through the substrate. Furthermore, the substrate is preferably formed such that it is radiation-transmissive to the radiation generated in the active region, such that the substrate can also be utilized in a simplified manner for coupling out radiation from the semiconductor chip.

Furthermore, the materials—GaN and SiC—mentioned above for the substrate have, for a semiconductor layer sequence based on nitride compound semiconductors, a refractive index which is greater than (for SiC) or equal to (for GaN) the (if appropriate average) refractive index of the semiconductor layer sequence, in particular of the active region and/or of a semiconductor layer of the semiconductor layer(s) 15 that delimits the semiconductor layer sequence on the part of the substrate 4. The refractive index of SiC is approximately 2.7, and a typical refractive index of a material from the material system (In,Al)GaN is approximately 2.5. The radiation transfer of radiation from the semiconductor layer sequence 2 into the substrate 3 is facilitated on account of the reduced or completely omitted total reflection at the interface of semiconductor layer sequence and substrate, in particular relative to a sapphire substrate, which has a lower refractive index than GaN-based materials.

Furthermore, in the case of a substrate having a high refractive index, the substrate can serve in a simplified manner for the beam guiding of radiation in the direction of the side surfaces 17 of the substrate. The substrate can be embodied in particular for wave guiding. The radiation can be guided in the direction of the side surfaces by reflection at that surface of the substrate which is remote from the semiconductor layer sequence, in particular by reflection at the mirror layer and (total) reflection at that surface of the substrate which faces the semiconductor layer sequence. The side surfaces 17 can then serve multiply for coupling out radiation from the semiconductor chip 1. The embodiment of the semiconductor chip as a volume emitter with a comparatively low surface luminance is facilitated by a utilization of the substrate for coupling out.

Such beam guiding in the substrate in the direction of the side surfaces 17 is particularly advantageous in the case of a semiconductor chip 1 in accordance with the exemplary embodiments in FIGS. 7A, 7B and 7C, which have side surfaces 17 running substantially perpendicular to the main extension direction D of the semiconductor layer sequence 2 and two surfaces running substantially perpendicular to said side surfaces.

This beam guiding in the substrate 4 is indicated schematically on the basis of the beam 23 in FIG. 7A. A substrate having a higher refractive index than the semiconductor layer sequence 2, for example an SiC substrate for an (In,Al)GaN-based semiconductor layer sequence was assumed in this case. Accordingly, the beam 23 upon entering into the substrate 4 is refracted toward the surface normal 24 to that surface 25 of the substrate 4 which faces the semiconductor layer sequence 2. After reflection(s) at the mirror layer 16 and total reflection(s) at the surface 25, the beam couples out from the substrate 4 via the side surface 17.

Two advantageous embodiments of a semiconductor chip in accordance with FIG. 7A are illustrated in FIGS. 7B and 7C.

The substrate 4 here has a thickness t in each case. The length l, and likewise the length w, gives an edge length of the chip (cf. the plan view in FIG. 8).

The edge lengths l and w can be different, but are preferably equal in magnitude, such that the chip is embodied like a square in plan view. Furthermore, the edge length l preferably corresponds to the length of the substrate. The thickness t is preferably made constant in a lateral direction.

Typical chip edge lengths l, w lie between 200 μm and 300 μm inclusive, and are for example 250 μm.

In the exemplary embodiment in accordance with FIG. 7B, the substrate is embodied with a thickness t and a length corresponding to the edge length l. The area content in the side surfaces 17 is thus in each case l*t given identical edge lengths (l=w), and l*t and w*t, respectively, given different edge lengths. The ratio l:t preferably lies between in each case 0.8 and 1.2 inclusive. The chip can be embodied in particular in cube-like fashion. It is particularly preferably the case here that in addition l=t.

The area contents of the surface 25 (l*w) and of the respective side surfaces 17 of the substrate (l*t and l*w, respectively) are likewise in the ratio of 1:t given identical edge lengths l and w.

The luminance at the side surfaces 17 can advantageously be reduced with at the same time reliable mountability of the chip by means of such dimensioning of the area contents. The substrate is preferably provided with such a thickness or, if appropriate, is thinned to such a thickness.

Since the semiconductor layer sequence is comparatively thin relative to the chip dimensions, the substrate thickness crucially determines the chip height. The entire chip can be embodied in particular with a cube-like enveloping basic form.

In the exemplary embodiment in accordance with FIG. 7C, the thickness t of the substrate 4 is less than or equal to (½)*l, preferably less than or equal to (⅓)*l. The thickness of the substrate can be for example 100 μm or less, preferably 80 μm or less. For this purpose, it is expedient for the substrate 4 to be correspondingly thinned. The thinning is effected preferably after the semiconductor layer sequence 2 has been grown on the substrate 4. A particularly flat and correspondingly space-saving semiconductor chip can be provided with such a thin embodiment of the substrate. Moreover, in the case of an electrically conductive substrate, the forward voltage can be advantageously reduced.

The substrate is expediently a substrate having a high refractive index by comparison with the semiconductor layer sequence, such as an SiC substrate in the case of a semiconductor layer sequence based on nitride compound semiconductors. By comparison with a substrate having a low refractive index, such as a sapphire substrate, which has a refractive index lower than that of nitride compound semiconductor materials, beams generated in the active region 3 run more steeply to an increased extent in the substrate, that is to say at smaller angles with respect to the surface normal 24. The proportion of radiation which enters into the semiconductor layer sequence 2 again after a reflection at the mirror layer 16 and couples out from the chip 1 via that side of the semiconductor layer sequence 2 which is remote from the substrate 4 can thus be increased. The luminance at the side surfaces 17 is advantageously reduced by comparison with a semiconductor chip having a substrate having a low refractive index.

The exemplary embodiments of the semiconductor chip as shown in FIGS. 1 to 6 have, in contrast to FIGS. 7A-7C, a substrate 4 having side surface regions 18 that are beveled with respect to the main extension direction D, in particular at an acute angle with respect to said direction. The proportion of radiation coupled out directly via the beveled side surface region 18 can be increased by means of such beveling, particularly in the exemplary embodiments in accordance with FIGS. 1, 2, 4, 5 and 6.

In the exemplary embodiment in accordance with FIG. 3, the continuous mirror layer 16 also extends along the side surface 17 and in particular along the beveled side surface region 18. As a result of this, the radiation power coupled out from the chip through a partial region—not covered by the semiconductor layer sequence—of that surface of the substrate 4 which faces the semiconductor layer sequence 2 can be increased by means of reflection at the mirror layer 16. This is indicated schematically on the basis of the beam 19 in FIG. 3.

In the exemplary embodiments in accordance with FIGS. 1, 4, 5 and 6, the substrate has side surface regions 20 which run parallel to one another and in particular substantially perpendicular to the main extension direction D of the semiconductor layer sequence 2. The side surface regions 20 are preferably disposed downstream of the beveled side surface regions 18 as seen from the semiconductor layer sequence 2. At the side surface regions 20, the semiconductor chip 1 can be grasped by means of a mounting tool in a simplified manner and be positioned on an external electrical connection conductor and thereupon be fixed on the latter and be electrically contact-connected.

In this case, the substrate 4 tapers in the region of the beveled side surface regions 18 with increasing distance from the semiconductor layer sequence 2 and has a substantially constant cross section in the region of the side surface regions 20. In particular, in these exemplary embodiments, in the substrate 4, a cutout 21 extending from that surface of the substrate which is remote from the semiconductor layer sequence 2 in the direction of the semiconductor layer sequence is formed in the substrate. The side surface can have a staircase-like structure or be curved (not explicitly illustrated) in the region in which the substrate tapers or in the region of the cutout. The radiation power coupled out directly from the substrate in this region can thus be more extensively increased.

Figure 1:
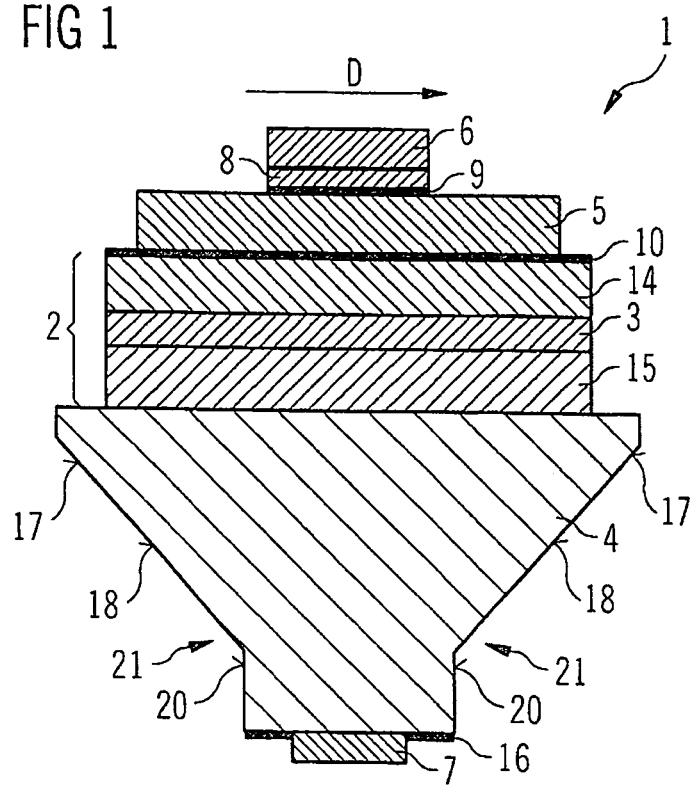
FIG. 1 shows a schematic sectional view of an exemplary embodiment of an optoelectronic semiconductor chip.
Figure 2:
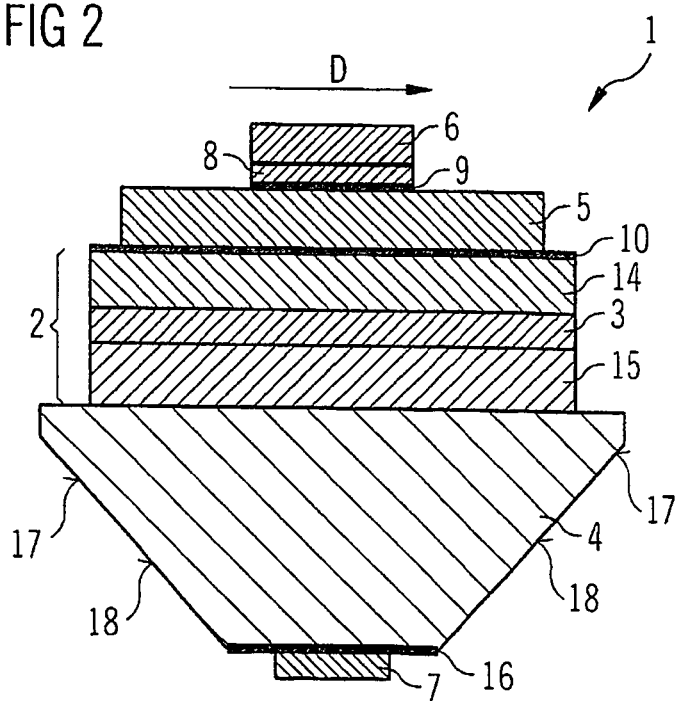
FIG. 2 shows a schematic sectional view of a further exemplary embodiment of an optoelectronic semiconductor chip.
Figure 5:
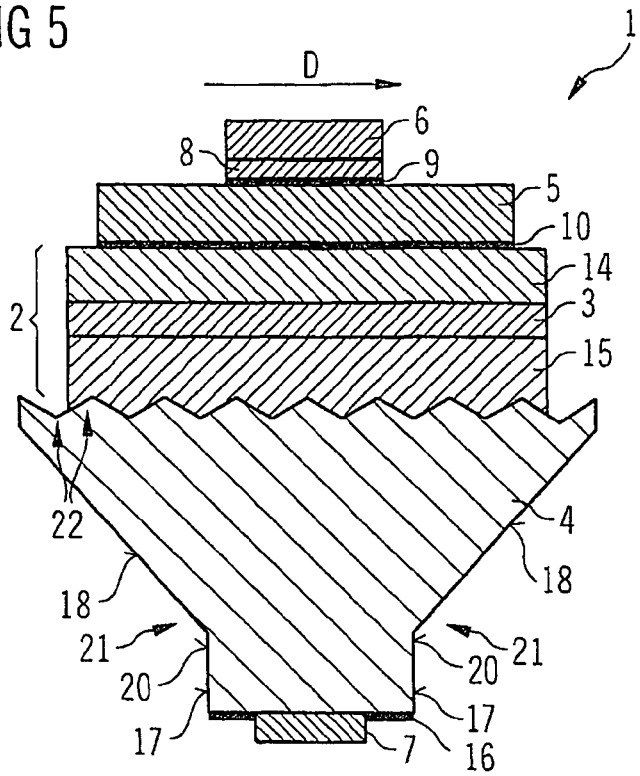
FIG. 5 shows a schematic sectional view of a further exemplary embodiment of an optoelectronic semiconductor chip.

In the exemplary embodiments in accordance with FIGS. 4, 5 and 6, the semiconductor chip 1 has elevations and depressions 22. By means of such elevations and depressions, it is possible to influence the reflection angle for reflection of radiation at the respective interfaces having the elevations and depressions. In particular, it is possible to disturb a total reflection at said interfaces. The radiation power coupled out from the semiconductor chip 1 can thus be increased.

The elevations and depressions 22 can be formed for example in that side of the contact layer 5 which is remote from the semiconductor layer sequence (FIG. 6), that side of the semiconductor layer sequence 2 which is remote from the substrate 4 (FIG. 4) or in that side of the substrate which faces the semiconductor layer sequence 2 (FIG. 5). The depth of one depression or of a plurality of depressions, preferably of all the depressions in the respective layer, is preferably 100 nm or more. In this way, the reflection at the respective structured interface can be disturbed particularly efficiently. The elevations and depressions can be embodied as regular structures, with a recurring, preferably periodic arrangement of the elevations and depressions, or as an irregular roughening with an irregular, preferably substantially statistical distribution of the elevations and depressions. The elevations and depressions can be formed in the respective layer for example by means of etching or sandblasting as already described further above.

A semiconductor chip similar to the semiconductor chips shown in FIGS. 1, 4, 5 and 6 is described in WO 01/61764 or WO 01/61765, the entire disclosure content of both of which is hereby incorporated herein by reference. The shaping of the substrate 4 that is schematically illustrated in said FIGS can be achieved by means of a correspondingly shaped saw blade used for singulating the chip from the wafer assemblage. The sawn side surfaces and in particular also the substrate do not require further processing for this shaping.

By comparison with the chips described in WO 01/61764 or WO 01/61765, the coupling-out efficiency of the semiconductor chip can be increased by 30% or more, in particular up to 50%, in the context of the invention.

Overall, a volume emitting semiconductor chip having a reduced surface luminance, increased coupling-out efficiency and also, on account of the radiation-transmissive electrically conductive contact layer, high current-carrying capacity and hence an increased ESD strength can be formed by means of the semiconductor chips described above.

Such a semiconductor chip is particularly suitable for example for backlighting, e.g. of a display device, for illumination or for visualization, e.g. as a pixel or as part of a pixel in a display or for use in a projection device.

On account of the arrangement of the connection and the counter-connection on different sides of the semiconductor layer sequence, the semiconductor chip, on the part of the counter-connection, can be mounted on an external connection conductor and be electrically conduct-connected in a simple manner by means of an adhesive formed in electrically conductive fashion, e.g. silver conductive adhesive, or a solder. In the case of a chip having both connections on the same side of the semiconductor layer sequence, either two wire bonds or, in the case of flip-chip mounting, adhesive bonds in direct proximity to one another and to the semiconductor layer sequence and the active region are necessary for contact-connection. Wire bonds are comparatively complicated to produce by comparison with an adhesive bond, while the risk of a short circuit of the chip is increased in the case of flip-chip mounting with adhesive bonds on a connection conductor.

The invention is not restricted by the description on the basis of the exemplary embodiments. Rather, the invention encompasses any new feature and also any combination of features, which in particular comprises any combination of features in the patent claims. Even if this feature or this combination itself is not explicitly specified in the patent claims or exemplary embodiments.

The invention claimed is:

1. An optoelectronic semiconductor chip having a semiconductor layer sequence, which comprises an active region suitable for generating radiation and has a lateral main extension direction, wherein
   the semiconductor layer sequence is arranged on a substrate having a side surface,
   the side surface has a side surface region that is at least one of beveled with respect to the main extension direction and formed to include a cutout,
   the semiconductor chip has a radiation-transmissive and electrically conductive contact layer, and
   a single connection layer including only a single layer adjoining the contact layer is arranged in the semiconductor layer sequence, the single connection layer having a dopant concentration that is greater in a region on a side facing the contact layer than in a region on a side facing the active region.

2. The semiconductor chip as claimed in claim 1, wherein the contact layer contains a radiation-transmissive and electrically conductive oxide.

3. The semiconductor chip as claimed in claim 2, wherein the active region of the semiconductor layer sequence contains a nitride compound semiconductor material.

4. The semiconductor chip as claimed in claim 2, wherein the refractive index of the substrate is at least one of greater than or equal to the refractive index of the active region and greater than or equal to the refractive index of a semiconductor layer terminating the semiconductor layer sequence on the side of the semiconductor layer sequence facing the substrate.

5. The semiconductor chip as claimed in claim 2, wherein the substrate is radiation-transmissive to the radiation generated in the active region.

6. The semiconductor chip as claimed in claim 2, wherein a surface of the substrate is formed as a radiation coupling-out area of the semiconductor chip.

7. The semiconductor chip as claimed in claim 6, wherein the surface of the substrate formed as a radiation coupling-out area of the semiconductor chip is at least one of the side surface and a surface facing the semiconductor layer sequence.

8. The semiconductor chip as claimed in claim 2, wherein the cutout extends from that surface of the substrate which is remote from the semiconductor layer sequence in the direction of the semiconductor layer sequence.

9. The semiconductor chip as claimed in claim 2, wherein the cutout is formed by means of the side surface region running obliquely with respect to the semiconductor layer sequence and by means of a further side surface region of the side surface, wherein the further side surface region runs substantially perpendicular to the semiconductor layer sequence.

10. The semiconductor chip as claimed in claim 2, wherein the substrate tapers with increasing distance from the semiconductor layer sequence.

11. The semiconductor chip as claimed in claim 2, wherein a tunnel contact is formed between the contact layer and the active region.

12. The semiconductor chip as claimed in claim 11, wherein the tunnel contact has a tunnel contact layer monolithically integrated into the semiconductor layer sequence.

13. The semiconductor chip as claimed in claim 2, wherein at least one of a surface of the substrate, that surface of the semiconductor layer sequence which faces the contact layer, and that surface of the contact layer which is remote from the semiconductor layer sequence has elevations and depressions.

14. The semiconductor chip as claimed in claim 2, wherein the ratio of the area content in that surface of the substrate which faces the semiconductor layer sequence to the area content in a side surface that laterally delimits the semiconductor chip is less than or equal to two.

15. The semiconductor chip as claimed in claim 2, wherein the electrically conductive oxide is a metal oxide.

16. The semiconductor chip as claimed in claim 1, wherein the connection layer is a single layer.

17. An optoelectronic semiconductor chip having a semiconductor layer sequence, which comprises an active region suitable for generating radiation and has a lateral main extension direction, wherein
   the semiconductor layer sequence is arranged on a substrate having a side surface, the side surface has a side surface region that is at least one of beveled with respect to the main extension direction and formed to include a cutout, the semiconductor chip has a radiation-transmissive and electrically conductive contact layer, and a tunnel contact formed between the contact layer and the active region, the tunnel contact having a tunnel contact layer monolithically integrated into the semiconductor layer sequence, wherein the tunnel contact has two tunnel contact layers of different conduction types that are monolithically integrated into the semiconductor layer sequence.

18. The semiconductor chip as claimed in claim 17, wherein an uppermost layer of the semiconductor layer sequence directly adjoins one of the two tunnel contact layers, and the one of the two tunnel contact layers has the same conduction type as the uppermost layer of the semiconductor layer sequence 19. An optoelectronic semiconductor chip having a semiconductor layer sequence, which comprises an active region suitable for generating radiation and is arranged on a substrate, wherein the semiconductor chip has a radiation-transmissive and electrically conductive contact layer, and a refractive index of the substrate is at least one of greater than or equal to a refractive index of the active region and greater than or equal to a refractive index of a semiconductor layer terminating the semiconductor layer sequence on the side of the semiconductor layer sequence facing the substrate, and a single connection layer including only a single layer adjoining the contact layer is arranged in the semiconductor layer sequence, the single connection layer having a dopant concentration which is greater in a region on a side facing the contact layer than in a region on a side facing the active region.

20. The semiconductor chip as claimed in claim 19, wherein the contact layer contains a radiation-transmissive and electrically conductive oxide.

21. An optoelectronic semiconductor chip having a semiconductor layer sequence, which comprises an active region suitable for generating radiation and is arranged on a substrate, wherein the semiconductor layer sequence contains a nitride compound semiconductor material, the semiconductor chip has a radiation-transmissive and electrically conductive contact layer, which is electrically conductively connected to an electrical connection of the semiconductor chip, and the electrical connection and an electrical counter-connection of the semiconductor chip are arranged on opposite sides of the semiconductor layer sequence, and a single connection layer including only a single layer adjoining the contact layer is arranged in the semiconductor layer sequence, the single connection layer having a dopant concentration which is greater in a region on a side facing the contact layer than in a region on a side facing the active region.

22. The semiconductor chip as claimed in claim 21, wherein the contact layer contains a radiation-transmissive and electrically conductive oxide.

23. An optoelectronic semiconductor chip having a semiconductor layer sequence, which comprises an active region suitable for generating radiation and is arranged on a substrate, wherein the semiconductor chip has a radiation-transmissive and electrically conductive contact layer, and a refractive index of the substrate is at least one of greater than or equal to a refractive index of the active region and greater than or equal to a refractive index of a semiconductor layer terminating the semiconductor layer sequence on the side of the semiconductor layer sequence facing the substrate, and a tunnel contact formed between the contact layer and the active region, the tunnel contact having a tunnel contact layer monolithically integrated into the semiconductor layer sequence, wherein the tunnel contact has two tunnel contact layers of different conduction types that are monolithically integrated into the semiconductor layer sequence.

24. An optoelectronic semiconductor chip having a semiconductor layer sequence, which comprises an active region suitable for generating radiation and is arranged on a substrate, wherein the semiconductor layer sequence contains a nitride compound semiconductor material, the semiconductor chip has a radiation-transmissive and electrically conductive contact layer, which is electrically conductively connected to an electrical connection of the semiconductor chip, and the electrical connection and an electrical counter-connection of the semiconductor chip are arranged on opposite sides of the semiconductor layer sequence, and a tunnel contact formed between the contact layer and the active region, the tunnel contact having a tunnel contact layer monolithically integrated into the semiconductor layer sequence, wherein the tunnel contact has two tunnel contact layers of different conduction types that are monolithically integrated into the semiconductor layer sequence.

* * * * *